(12) United States Patent
Shinohara

(10) Patent No.: US 11,271,105 B2
(45) Date of Patent: Mar. 8, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Daisuke Shinohara, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/940,671

(22) Filed: Jul. 28, 2020

(65) Prior Publication Data

US 2021/0193833 A1 Jun. 24, 2021

(30) Foreign Application Priority Data

Dec. 24, 2019 (JP) .............................. JP2019-232931

(51) Int. Cl.
*H01L 29/78* (2006.01)
*H01L 29/10* (2006.01)
(Continued)

(52) U.S. Cl.
CPC ...... *H01L 29/7825* (2013.01); *H01L 29/1095* (2013.01); *H01L 29/402* (2013.01);
(Continued)

(58) Field of Classification Search
CPC ......... H01L 29/10; H01L 29/40; H01L 29/78; H01L 29/1095; H01L 29/402;
(Continued)

(56) References Cited

U.S. PATENT DOCUMENTS 8,357,986 B2 *  1/2013  Wang .................. H01L 29/7835
                                                    257/492
9,356,138 B2     5/2016  Fujii
(Continued)

FOREIGN PATENT DOCUMENTS

JP    2009-278100 A    11/2009
JP    2009-302450 A    12/2009
JP    2015-162581 A     9/2015

*Primary Examiner* — Chuong A Luu
(74) *Attorney, Agent, or Firm* — Allen & Overy LLP

(57) ABSTRACT

A semiconductor device includes a semiconductor part having a recess formed in an upper surface thereof, an insulating member provided in a portion of the recess, a first electrode, a gate insulating film thinner than the insulating member. The first electrode includes a first part provided in another portion of the recess, and a second part provided higher than the insulating member. The gate insulating film is provided between the semiconductor part and the first part. The semiconductor part includes a first layer of a first conductivity type contacting the gate insulating film, second and third layers of a second conductivity type contacting the first layer and being connected to a source contact and a drain contact. The recess is positioned between the source contact and the drain contact when viewed from above. The insulating member is provided between the first part and the third layer.

10 Claims, 3 Drawing Sheets

(51) Int. Cl.
*H01L 29/423* (2006.01)
*H01L 29/40* (2006.01)

(52) U.S. Cl.
CPC ........ *H01L 29/408* (2013.01); *H01L 29/4236* (2013.01); *H01L 29/42376* (2013.01)

(58) Field of Classification Search
CPC . H01L 29/408; H01L 29/423; H01L 29/7825; H01L 29/4236; H01L 29/42376; H01L 29/0856; H01L 29/0869; H01L 29/0873; H01L 29/0886; H01L 29/42352; H01L 29/42336; H01L 29/66628; H01L 29/66613; H01L 29/66734; H01L 29/0649; H01L 29/0653; H01L 29/7813
USPC ........................................................ 257/339
See application file for complete search history.

(56) References Cited

U.S. PATENT DOCUMENTS

2009/0256212 A1* 10/2009 Denison .............. H01L 29/7825
257/408
2019/0035929 A1* 1/2019 Syue ................. H01L 29/42368

* cited by examiner

SEMICONDUCTOR DEVICE

CROSS-REFERENCE TO RELATED APPLICATIONS

This application is based upon and claims the benefit of priority from Japanese Patent Application No. 2019-232931, filed on Dec. 24, 2019; the entire contents of which are incorporated herein by reference.

FIELD

Embodiments relate to a semiconductor device.

BACKGROUND

Conventionally, DMOS (Diffused Metal Oxide Semiconductor Field Effect Transistor) has been used as a switching element for power control. Both a high breakdown voltage and a low ON-resistance are desirable for DMOS.

DETAILED DESCRIPTION

A semiconductor device according to an embodiment includes a semiconductor part having a recess formed in an upper surface of the semiconductor part, an insulating member provided in a portion of the recess, a first electrode, a gate insulating film thinner than the insulating member, a source contact provided on the semiconductor part, and a drain contact provided on the semiconductor part. The first electrode includes a first part provided in another portion of the recess, and a second part provided higher than the insulating member. The gate insulating film is provided between the semiconductor part and the first part. The semiconductor part includes a first layer of a first conductivity type contacting the gate insulating film, a second layer of a second conductivity type contacting the first layer and being connected to the source contact, and a third layer of the second conductivity type contacting the first layer and being connected to the drain contact. The recess is positioned between the source contact and the drain contact when viewed from above. The insulating member is provided between the first part and the third layer.

First Embodiment

First, a first embodiment will be described.

Figure 1:
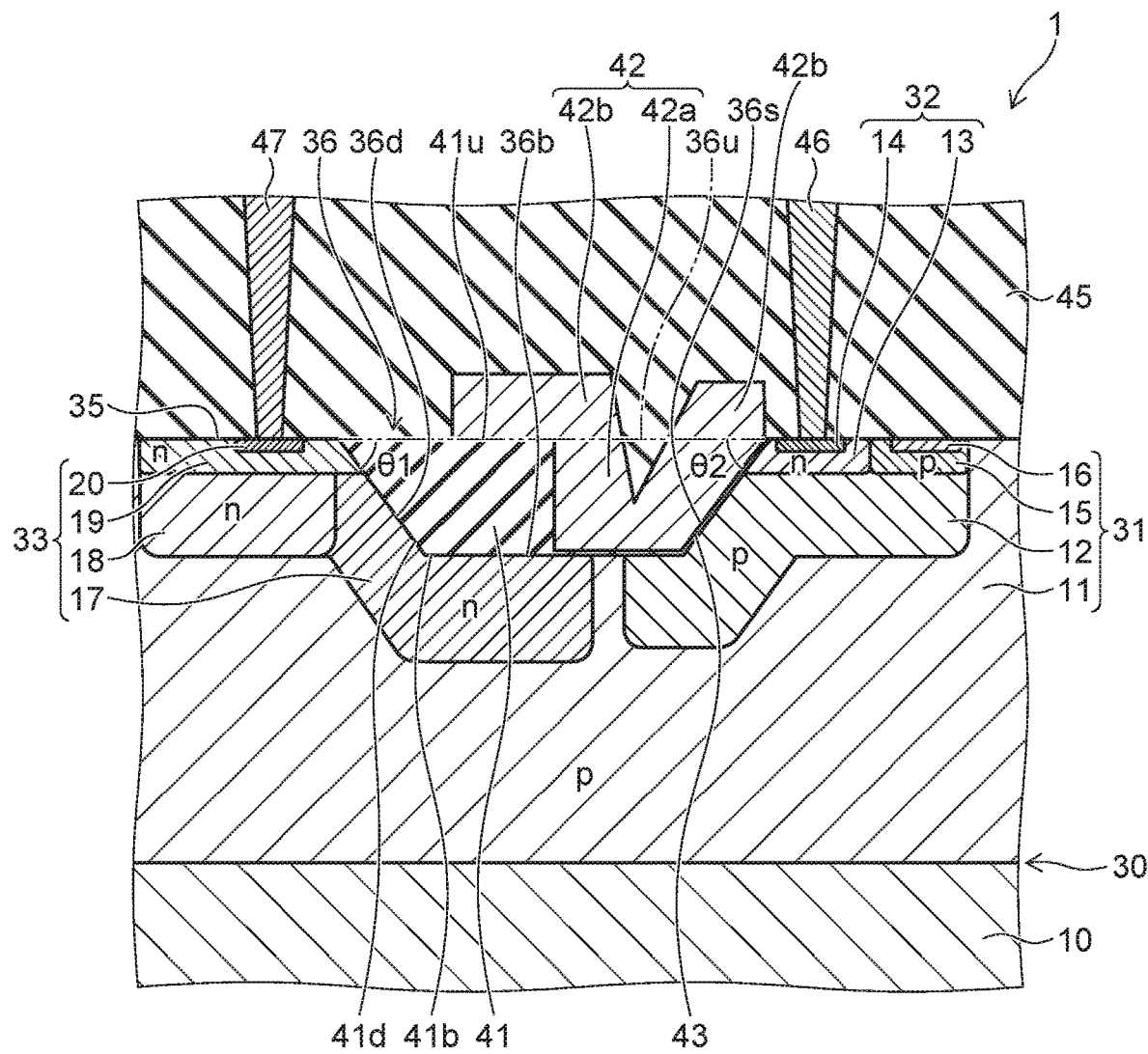
FIG. 1 is a cross-sectional view showing a semiconductor device according to a first embodiment.

FIG. 1 is a cross-sectional view showing a semiconductor device according to the embodiment.

FIG. 1 is schematic; and the components are omitted or exaggerated as appropriate. This is similar for FIG. 2 and FIGS. 3A and 3B described below as well.

In the semiconductor device 1 according to the embodiment as shown in FIG. 1, a silicon substrate 10 is provided; and an epitaxial layer 11 is provided on the silicon substrate 10. The epitaxial layer 11 is formed by epitaxially growing silicon from the upper surface of the silicon substrate 10; and the conductivity type of the epitaxial layer 11 is, for example, a p-type.

A p-type well 12 of the p-conductivity type is provided on a portion of the epitaxial layer 11. The impurity concentration of the p-type well 12 is greater than the impurity concentration of the epitaxial layer 11. A source layer 13 of the n-conductivity type is provided on a portion of the p-type well 12, A source contact layer 14 of the n⁺-conductivity type is provided on a portion of the source layer 13. The impurity concentration of the source contact layer 14 is greater than the impurity concentration of the source layer 13.

A body layer 15 of the p-conductivity type is provided on another portion of the p-type well 12. The impurity concentration of the body layer 15 is greater than the impurity concentration of the p-type well 12. A body contact layer 16 of the p⁺-conductivity type is provided on a portion of the body layer 15, The impurity concentration of the body contact layer 16 is greater than the impurity concentration of the body layer 15. For example, the body layer 15 contacts the source layer 13.

A drift layer 17 of the n-conductivity type and an n-type well 18 of the n-conductivity type are provided on another portion of the epitaxial layer 11. The impurity concentration of the n-type well 18 is greater than the impurity concentration of the drift layer 17. The drift layer 17 and the n-type well 18 contact each other. A drain layer 19 of the n-conductivity type is provided on a portion of the drift layer 17 and on the n-type well 18. The impurity concentration of the drain layer 19 is greater than the impurity concentration of the n-type well 18. A drain contact layer 20 of the n⁺-conductivity type is provided on a portion of the drain layer 19. The impurity concentration of the drain contact layer 20 is greater than the impurity concentration of the drain layer 19.

A semiconductor part 30 is formed of the silicon substrate 10, the epitaxial layer 11, the p-type well 12, the source layer 13, the source contact layer 14, the body layer 15, the body contact layer 16, the drift layer 17, the n-type well 18, the drain layer 19, and the drain contact layer 20. For example, the semiconductor part 30 is made of single-crystal silicon; and impurities are introduced to portions of the semiconductor part 30.

A first layer 31 of the p-conductivity type is formed of the epitaxial layer 11, the p-type well 12, the body layer 15, and the body contact layer 16 of the semiconductor part 30. A second layer 32 of the n-conductivity type is formed of the source layer 13 and the source contact layer 14 of the semiconductor part 30. A third layer 33 of the n-conductivity type is formed of the drift layer 17, the n-type well 18, the drain layer 19, and the drain contact layer 20 of the semiconductor part 30. The second layer 32 and the third layer 33 contact the first layer 31 and are provided, for example, on the first layer 31. In other words, the semiconductor part 30 includes the first layer 31, the second layer 32, and the third layer 33.

The conductivity type of the epitaxial layer 11 may be the n-type. In such a case, the p-type first layer 31 includes the p-type well 12, the body layer 15, and the body contact layer 16; the n-type second layer 32 includes the source layer 13 and the source contact layer 14; and the n-type third layer 33 includes the epitaxial layer 11, the drift layer 17, the n-type well 18, the drain layer 19, and the drain contact layer 20. In such a case as well, the second layer 32 and the third layer 33 contact the first layer 31.

A recess 36 is formed in an upper surface 35 of the semiconductor part 30. In a cross section including the source layer 13 and the drain layer 19, the recess 36 has an inverted trapezoidal configuration and has a tapered configuration. The recess 36 has a side surface 36s at the source layer 13 side, a side surface 36d at the drain layer 19 side, and a bottom surface 36b. The side surface 36s and the side surface 36d have tapered configurations. The side surface of the recess 36 is not limited to a tapered configuration in a cross section along the page surface depth direction of FIG. 1, i.e., a cross section orthogonal to the cross section including the source layer 13 and the drain layer 19. The bottom surface 36b is positioned between the side surface 36s and the side surface 36d and contacts the side surface 36s and the side surface 36d. An imaginary plane that extends between the upper edge of the side surface 36s and the upper edge of the side surface 36d is taken as an upper surface 36u of the recess 36.

The source layer 13 is exposed at the upper portion of the side surface 36s. The p-type well 12 is exposed from the lower portion of the side surface 36s to the part of the bottom surface 36b at the side surface 36s side. The drain layer 19 is exposed at the upper portion of the side surface 36d. The drift layer 17 is exposed from the lower portion of the side surface 36d to the part of the bottom surface 36b at the side surface 36d side. The epitaxial layer 11 is exposed between the part of the bottom surface 36b where the p-type well 12 is exposed and the part of the bottom surface 36b where the drift layer 17 is exposed.

An insulating member 41 is provided in a part of the recess 36 at the drain layer 19 side. The insulating member 41 is made of, for example, silicon oxide and is formed by, for example, CVD (Chemical Vapor Deposition) using TECHS (Tetraethyl orthosilicate ($Si(OC_2H_5)_4$)) as a source material.

A side surface 41d of the insulating member 41 is the same as the side surface 36d of the recess 36. A bottom surface 41b of the insulating member 41 is the same as the part of the bottom surface 36b at the side surface 36d side. The side surface 41d and the bottom surface 41b of the insulating member 41 contact the third layer 33. More specifically, the upper portion of the side surface 41d contacts the drain layer 19; and the bottom surface 41b and the lower portion of the side surface 41d contact the drift layer 17. An upper surface 41u of the insulating member 41 is the same as the upper surface 36u of the recess 36. An angle θ1 between the side surface 41d and the upper surface 41u of the insulating member 41 is acute, e.g., not less than 10 degrees and not more than 85 degrees.

An electrode 42 is provided over the insulating member 41 from a part of the recess 36 at the source layer 13 side. In other words, the electrode 42 includes a first part 42a provided in the recess 36, and a second part 42b provided higher than the insulating member 41. The first part 42a is provided between the insulating member 41 and a gate insulating film 43. The second part 42b is provided higher than the first part 42a, and includes a part provided in a region directly above the recess 36 and a part extending toward the drain layer 19. Thereby, a portion of the second part 42b contacts the upper surface 41u of the insulating member 41. The first part 42a and the second part 42b contact the insulating member 41. The electrode 42 may include a part other than the first part 42a and the second part 42b. The insulating member 41 is provided between the third layer 33 and the first part 42a of the electrode 42.

The gate insulating film 43 is provided in the recess 36 between the semiconductor part 30 and the first part 42a of the electrode 42. The gate insulating film 43 is provided at the part of the bottom surface 36b at the source layer 13 side and at the entire side surface 36s of the recess 36 at the source layer 13 side. The gate insulating film 43 is thinner than the insulating member 41. When the source-gate potential difference described below is 5 V, the thickness of the gate insulating film 43 is, for example, 10 to 15 nm. The gate insulating film 43 is made of, for example, silicon oxide and is formed by, for example, performing thermal oxidation of the semiconductor part 30. An angle θ2 between the surface of the gate insulating film 43 and the upper surface 36u of the recess 36 is acute, e.g., not less than 10 degrees and not more than 85 degrees. The gate insulating film 43 may be provided as a continuous body with the insulating member 41 or may be provided as a separate body.

An inter-layer insulating film 45 is provided on the semiconductor part 30, on the insulating member 41, and on the electrode 42. A source contact 46 and a drain contact 47 are provided in the inter-layer insulating film 45. The lower end of the source contact 46 is connected to the source contact layer 14. The lower end of the drain contact 47 is connected to the drain contact layer 20. The recess 36 is positioned between the source contact 46 and the drain contact 47 when viewed from above. A portion of the second part 42b of the electrode 42 is provided between the first part 42a and the drain contact 47 when viewed from above.

By the configuration recited above, an n-channel DMOS is formed in the semiconductor device 1. The conductivity types of the layers described above may be reversed. In such a case, a p-channel DMOS is formed. An impurity-including layer, STI (Shallow Trench Isolation (an element-separation insulating film)), etc., also may be formed in the semiconductor device 1 to separate the DMOS from other elements. The n-channel DMOS described above may be formed in the upper layer part of the silicon substrate 10 of the p-conductivity type without forming the epitaxial layer 11. The boundaries of the layers included in the semiconductor part 30 are not limited to being clearly observable.

For example, the semiconductor device 1 can be manufactured by the following method.

First, the epitaxial layer 11 is formed by epitaxially growing silicon on the upper surface of the silicon substrate 10. Then, the recess 36 that has a tapered configuration is formed in the upper surface of the epitaxial layer 11 by, for example, dry etching. Then, the surface of the epitaxial layer 11 is oxidized by performing thermal oxidation treatment. Then, the p-type well 12, the drift layer 17, and the n-type well 18 are formed by selectively ion-implanting impurities.

Continuing, silicon oxide is filled into the recess 36 by CVD using TEOS as a source material; and the upper surface of the silicon oxide is planarized by CMP (Chemical Mechanical Polishing), etc. Then, a portion of the silicon oxide filled into the recess 36 is selectively removed. Thereby, the remaining part of the silicon oxide becomes the insulating member 41. Then, the gate insulating film 43 is formed at the exposed surface of the semiconductor part 30 in the recess 36 by performing thermal oxidation treatment. Then, the electrode 42 is formed by depositing polysilicon and by patterning. Then, the source layer 13, the drain layer 19, the body layer 15, the source contact layer 14, the drain contact layer 20, and the body contact layer 16 are formed by selectively ion-implanting impurities.

Continuing, the inter-layer insulating film 45 is formed on the semiconductor part 30 by CVD using TEOS as a source material. Then, the source contact 46 and the drain contact 47 are formed in the inter-layer insulating film 45. The source contact 46 is connected to the source contact layer 14; and the drain contact 47 is connected to the drain contact layer 20. Thus, the semiconductor device 1 is manufactured.

An operation of the semiconductor device 1 according to the embodiment will now be described.

When driving the semiconductor device 1, a direct current voltage is applied between the source contact 46 and the drain contact 47. For example, a ground potential (0 V) is applied to the source contact 46 as a source potential; and a positive drain potential, e.g., 40 V is applied to the drain contact 47. For example, the source potential also is applied to the body contact layer 16.

When an ON-potential, e.g., 5 V is applied to the electrode 42 in this state, an inversion layer is formed in a part of the first layer 31 proximal to the gate insulating film 43; and a current flows between the source contact 46 and the drain contact 47. In other words, the DMOS is set to the ON-state. On the other hand, when an OFF-potential, e.g., 0 V is applied to the electrode 42, the inversion layer disappears; a depletion layer spreads; and the current is blocked. In other words, the DMOS is set to the OFF-state. At this time, an electric field is generated between the electrode 42 to which 0 V is applied and the third layer 33 to which 40 V is applied.

Effects of the embodiment will now be described.

In the semiconductor device 1, the first part 42a of the electrode 42 which is provided in the recess 36 functions as a gate electrode and switches between the ON-state and the OFF-state of the DMOS. On the other hand, the second part 42b of the electrode 42 extending onto the insulating member 41 functions as a field plate electrode and relaxes the concentration of the electric field in the OFF-state.

Here, the angle θ1 is acute; therefore, the side surface 41d of the insulating member 41 opposing the drain layer 19 is oblique downward to approach a region directly under the second part 42b. The distance between the third layer 33 and the second part 42b of the electrode 42 can be more uniform; and the concentration of the electric field can be suppressed thereby. As a result, the breakdown voltage of the DMOS is increased. The source-drain breakdown voltage can be controlled by adjusting the positional relationship between the end portion of the second part 42b at the drain side of the electrode 42 and the side surface 41d of the insulating member 41. The source-drain breakdown voltage of the DMOS in the semiconductor device 1 is, for example, 10 V or more.

In the ON-state, the electron current that flows from the source layer 13 to the drain layer 19 flows through the part of the first layer 31 along the gate insulating film 43 and the part of the third layer 33 along the gate insulating film 43 and the bottom surface 41b and the side surface 41d of the insulating member 41. The angle θ2 and the angle θ1 are acute; therefore, the electron current flows easily through the part of the first layer 31 along the gate insulating film 43 and the part of the third layer 33 along the side surface 41d of the insulating member 41. As a result, the ON-resistance of the DMOS is low.

The first part 42a of the electrode 42 opposes the first layer 31 of the semiconductor part 30 via the gate insulating film 43. Thereby, the part of the first layer 31 along the gate insulating film 43 acts as a channel layer. A portion of the channel layer is formed along the side surface 36s of the recess 36 and therefore extends in the vertical direction, i.e., in the direction from the source layer 13 toward the silicon substrate 10, in addition to the lateral direction, i.e., the direction from the source layer 13 toward the drain layer 19. Therefore, the necessary channel length can be realized as an entirety while reducing the size of the channel layer in the lateral direction. Downsizing of the semiconductor device 1 can be realized thereby.

In the semiconductor device 1, the source contact 46 is connected to the source contact layer 14; and the drain contact 47 is connected to the drain contact layer 20. Thereby the potentials can be supplied to the source and the drain from the upper surface side of the semiconductor part 30. Accordingly, in the semiconductor device 1, it is unnecessary to form deep trenches to supply the potentials to the source and the drain or form an electrode structure from the backside of the silicon substrate 10; and the versatility is high.

Second Embodiment

A second embodiment will now be described.

Figure 2:
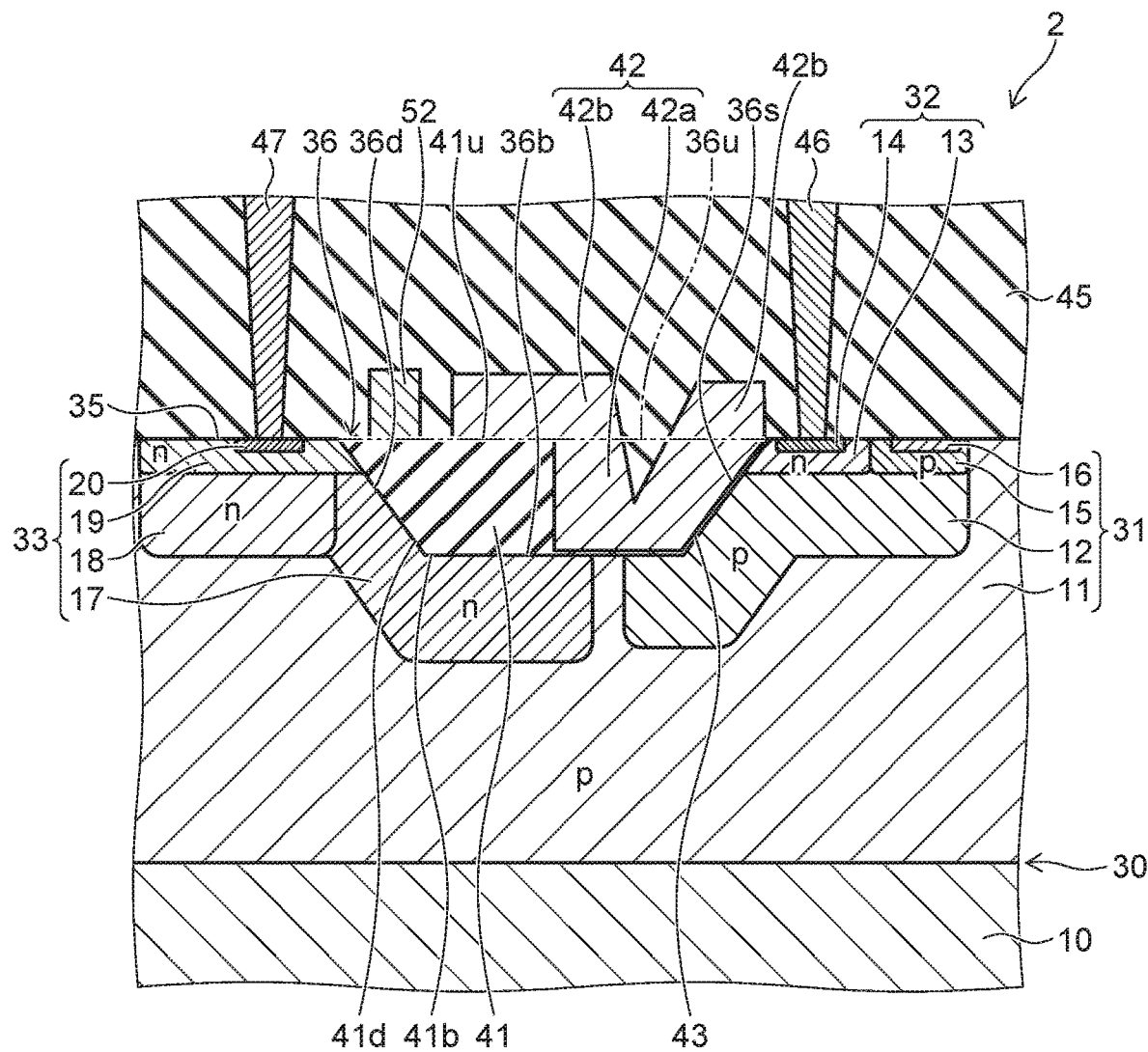
FIG. 2 is a cross-sectional view showing a semiconductor device according to a second embodiment.

FIG. 2 is a cross-sectional view showing a semiconductor device according to the embodiment.

In the semiconductor device 2 according to the embodiment as shown in FIG. 2, an electrode 52 is provided in addition to the configuration of the semiconductor device 1 according to the first embodiment. The electrode 52 is provided on the insulating member 41 between the drain contact 47 and the second part 42b of the electrode 42. The electrode 52 is separated from the electrode 42 and contacts the insulating member 41 and the inter-layer insulating film 45. A potential can be applied to the electrode 52 independently from the electrode 42.

In the OFF-state of the DMOS in the semiconductor device 2, an intermediate potential that is between the OFF-potential applied to the electrode 42 and the drain potential applied to the drain contact 47 is applied to the electrode 52. For example, the intermediate potential can be set to the same potential as the ON-potential applied to the electrode 42 in the ON-state. For example, an intermediate potential of 5 V may be applied to the electrode 52 when the OFF-potential is 0 V and the drain potential is 40 V.

The distribution of the electric field generated between the electrode 42 and the third layer 33 can be controlled thereby; and the concentration of the electric field can be relaxed. As a result, the breakdown voltage of the DMOS is improved further. On the other hand, in the ON-state, the ON-potential (e.g., 5 V) can be applied to the electrode 52; or the electrode 52 can be set to a floating state. Otherwise, the configuration, the operations, and the effects of the embodiment are similar to those of the first embodiment.

Third Embodiment

A third embodiment will now be described.

Figure 3A:
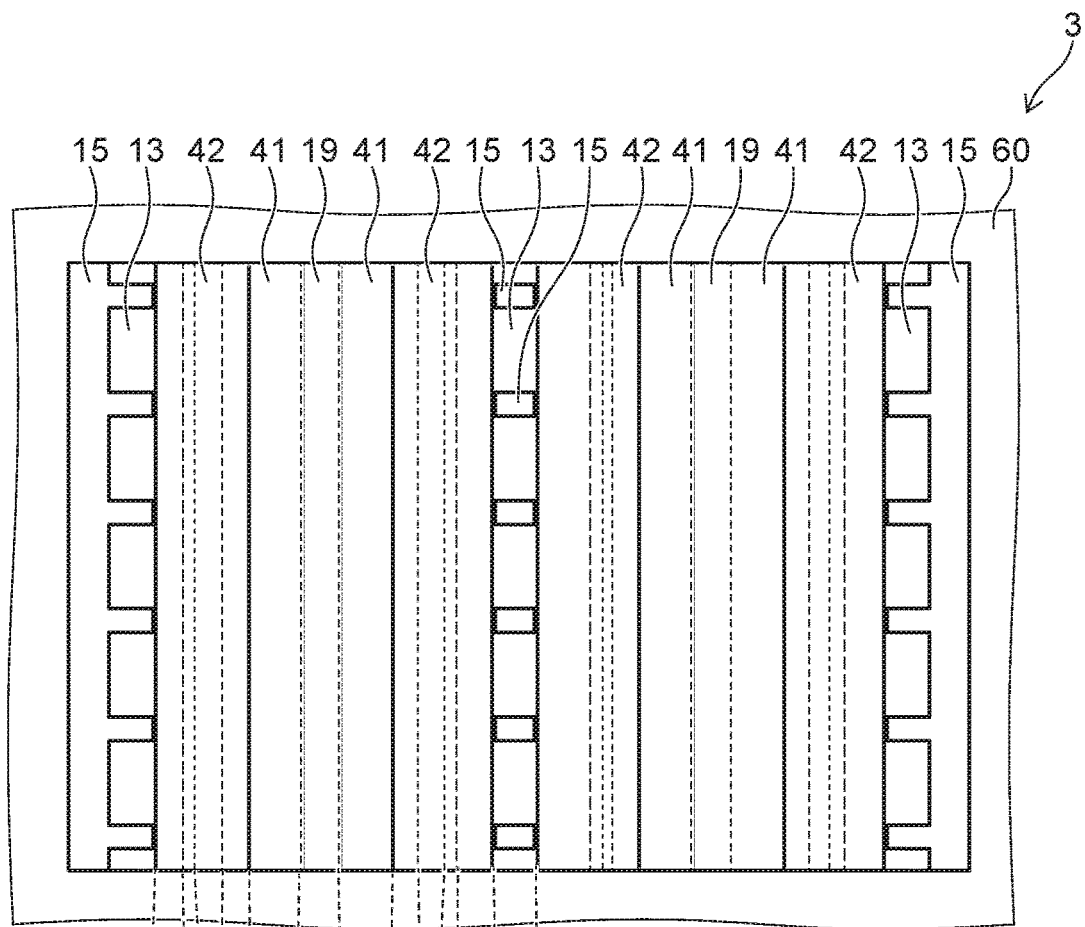
FIG. 3A is a plan view showing a semiconductor device according to a third embodiment.
Figure 3B:
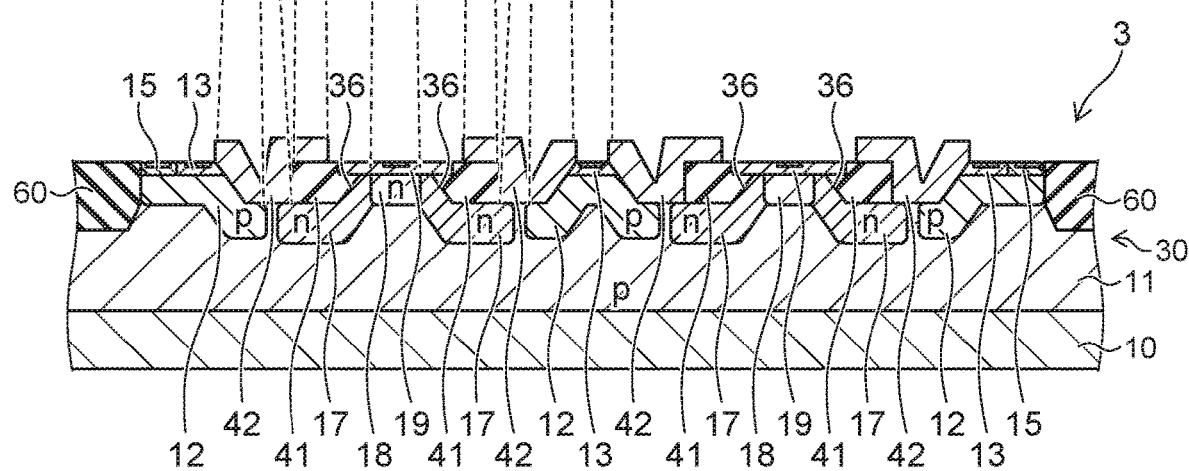
FIG. 3B is a cross-sectional view of the semiconductor device according to the third embodiment.

FIG. 3A is a plan view showing a semiconductor device according to the embodiment; and FIG. 3B is a cross-sectional view of the semiconductor device according to the embodiment.

In the semiconductor device 3 according to the embodiment as shown in FIGS. 3A and 3B, multiple DMOSs described in the first embodiment are formed. Specifically, the source layers 13 and the drain layers 19 are arranged alternately on a common silicon substrate 10 and a common epitaxial layer 11; and the recesses 36 each are formed between the source layer 13 and the drain layer 19. The insulating member 41, the electrode 42, and the gate insulating film 43 are provided in and above each recess 36. In each recess 36, the insulating member 41 is provided at the drain layer 19 side; and the electrode 42 and the gate insulating film 43 are provided at the source layer 13 side.

The source layer 13 and the body layer 15 are arranged alternately along a direction (the gate-width direction) orthogonal to the arrangement direction of the source layer 13 and the drain layer 19 (the gate-length direction). Thereby, between two adjacent DMOSs, the source layer 13 and the body layer 15 are shared; or the drain layer 19 is shared. The layers of the semiconductor part 30, the insulating member 41, the electrode 42, and the gate insulating film 43 extend along the gate-width direction. A STI 60 is provided on the semiconductor part 30 to surround the region where the multiple DMOSs are provided. For example, the STI 60 has a frame-shape when viewed from above.

According to the embodiment, between two adjacent DMOSs, the source layer 13 and the body layer 15 are shared; or the drain layer 19 is shared; thereby, the multiple DMOSs can be arranged with high integration. The density of the current controlled by the semiconductor device 3 can be increased thereby; and downsizing of the semiconductor device 3 can be realized.

Otherwise, the configuration, the operations, and the effects of the embodiment are similar to those of the first embodiment. As described in the second embodiment, the electrode 52 may be provided in the semiconductor device 3.

According to the embodiments described above, a semiconductor device can be realized in which both a high breakdown voltage and a low ON-resistance are possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor part having a recess formed in an upper surface of the semiconductor part;
   an insulating member provided in a portion of the recess;
   a first electrode including a first part and a second part, the first part being provided in an other portion of the recess, the second part being provided higher than the insulating member;
   a gate insulating film provided between the semiconductor part and the first part; the gate insulating film being thinner than the insulating member;
   a source contact provided on the semiconductor part; and
   a drain contact provided on the semiconductor part,
   the semiconductor part including
      a first layer contacting the gate insulating film, the first layer being of a first conductivity type,
      a second layer contacting the first layer, being connected to the source contact, and being of a second conductivity type, and
      a third layer contacting the first layer, being connected to the drain contact, and being of the second conductivity type,
   the recess being positioned between the source contact and the drain contact when viewed from above,
   the insulating member being provided between the first part and the third layer,
   an interface between the first layer and the third layer being positioned at a bottom surface of the recess,
   a portion of the second part covering a portion of the insulating member, and
   the first layer contacting a side surface and a bottom surface of the insulating member.

2. The device according to claim 1, wherein a portion of the second part is provided between the first part and the drain contact when viewed from above.

3. The device according to claim 1, wherein the third layer contacts the insulating member.

4. The device according to claim 1, wherein a side surface of the recess has a tapered configuration.

5. The device according to claim 1, wherein a first angle between an upper surface of the insulating member and a side surface of the insulating member at the third layer side is acute.

6. The device according to claim 5, wherein the first angle is not less than 10 degrees and not more than 85 degrees.

7. The device according to claim 1, wherein a second angle between a surface of the gate insulating film and an upper surface of the recess is acute.

8. The device according to claim 1, wherein the first part is provided between the insulating member and the gate insulating film.

9. The device according to claim 1, further comprising a second electrode provided on the insulating member between the first electrode and the drain contact.

10. The device according to claim 1, wherein
    the semiconductor part includes silicon, and
    the gate insulating film is an oxide film of silicon.

* * * * *